United States Patent [19]

Fang

[11] Patent Number: 6,001,174

[45] Date of Patent: Dec. 14, 1999

[54] METHOD FOR GROWING A DIAMOND CRYSTAL ON A RHEOTAXY TEMPLATE

[75] Inventor: Pao-Hsien Fang, Belmont, Mass.

[73] Assignee: Richard J. Birch, New London, N.H.; a part interest

[21] Appl. No.: 09/038,426

[22] Filed: Mar. 11, 1998

[51] Int. Cl.⁶ ..................................................... C30B 25/02
[52] U.S. Cl. ............................. 117/89; 117/94; 117/101; 117/929; 423/446; 427/577
[58] Field of Search ............................. 117/929, 89, 101, 117/94; 423/446; 427/577

[56] References Cited

U.S. PATENT DOCUMENTS

| 4,690,714 | 9/1987 | Li .............................................. 438/24 |
| 5,082,359 | 1/1992 | Kirkpatrick et al. .................... 423/446 |
| 5,363,798 | 11/1994 | Yoder ......................................... 117/89 |
| 5,771,845 | 6/1998 | Pisten ....................................... 122/366 |

*Primary Examiner*—Robert Kunemund
*Attorney, Agent, or Firm*—Richard J. Birch

[57] ABSTRACT

A method to grow diamond crystal by an utilization of liquid template on which carbon precursor is deposited. The liquid template is to replace the conventional solid template to improve the quality and the size of the diamond crystal through the inherent property of the liquid. Its ideal smoothness, its amorphosity and therefore, an absence of the grain boundary, and its high surface mobility for carbon aggregation to form diamond crystal, thus to grow diamond crystal.

25 Claims, No Drawings

METHOD FOR GROWING A DIAMOND CRYSTAL ON A RHEOTAXY TEMPLATE

BACKGROUND OF THE INVENTION

Diamond has many anticipated superiorities for various technological applications and therefore the diamond growth has been a forefront of material research in recent decades. There has been some progress in areas such as the rate of growth and the physical size of the polycrystals. These crystals can be oriented from each other. However, they are disjointed macroscopically or joined with multiple grain boundaries and a realization of a large single crystal diamond does not seem to be in sight. The present invention represents a drastically different synthesis approach by growing of diamond on liquids surface. The current prevailing practice of growing diamond is on solid substrate. A hindrance to grow a large area, single crystal diamond for many technological applications is a low mobility of the carbon species on the surface of a solid substrate. Another deficiency of a solid surface is the structural imperfection, such as the dislocation and the grain boundary, which could induce a prolific and random growth of diamond crystallites. Furthermore, these crystallites on the solid surface are immobile, and once after they are formed, they cannot organize among the neighbors to form jointly a single crystal.

A growth of diamond on a solid substrate is referred to as a solid epitaxy or simply, epitaxy. When the substrate during the crystal growth is a liquid, which is the case in the present invention, the process will be a rheotaxy. In rheotaxy, the substrate surface will have a perfect smoothness and no structural defects, such as the grain boundaries. A conceptual advantage of the liquid surface to grow diamond is the high mobility on two levels:

(1) On the atomic level, a carbon atom has a higher mobility on a liquid surface than on a solid surface. This mobility would facilitate an aggregation of the carbon atoms to form diamond crystallites, and (2) On the macroscopic level, diamond crystallites adhere comparatively weakly to the surface of liquid than a solid.

A combination of (1) and (2) produces the following benefits: In the liquid, due to a lower specific gravity of diamond than that of liquid to be adapted in the present invention, the diamond crystallites would float on the liquid. These floating islets could be mobile and could coalesce due to several mechanisms such as electric field, thermal fluctuations, gas turbulence from the carbon impact, and mechanical vibration from surroundings. With a manipulation of these sources, the crystallites could be aligned crystallographically and morphologically from each other to form a large single crystal. This will be the basis of the present invention.

BRIEF DESCRIPTION OF THE INVENTION

A prevailing method to prepare the carbon precursor for diamond syntheses is by a dissociation of hydrocarbons such as methane pyrolytically with an assistance of hot filament or a microwave plasma and known as a chemical vapor deposition (CVD).

Other methods, such as solid source to replace the vapor is a variation based on a similar principle of rheotaxy. One solid source of the present invention is fullerene. Fullerene is a molecule consisting of a large number of carbon atoms. For example, $C_{60}$ has sixty carbon atoms and $C_{70}$ has seventy carbon atoms. These atoms are held together with a weak binding energy and therefore can become an atomic carbon source by a thermal dissociation. Furthermore, these carbons have the right bond configuration to form diamond.

Another solid carbon source of the present invention is rare earth carbide. When these carbides come into contact with the rheotaxial liquid, an alloy from the rare earth with part of the rheotaxial substrate material and the carbon atoms are liberated and under a proper condition, aggregate among the carbons to form diamond.

In the solid source case, the materials are usually in a powder form. They can be pressed into a thin plate or deposited on another plate, such as graphite or quartz. The formed plate is placed on the surface of the rheotaxial liquid to proceed with the diamond synthesis.

Similar to the chemical vapor deposition, hydrogen ambient is necessary to prohibit a graphite formation in the solid source case as well.

Once the principle of the rheotaxial operation is understood, the diamond synthesis method, based on rheotaxy with a vapor or solid source of carbon is the same. Therefore, in the following, the vapor case, that is, CVD will be used in a generic sense to replace a redundant description for the solid case.

To establish the rheotaxy for diamond crystal growth, some criteria of the rheotaxial material are: (i) The material does not react with carbon, the element of diamond, to form a compound, (ii) The material is liquids at the temperature for diamond formation, and (iii) The material has low vapor pressure during the diamond deposition. Some substrate materials are listed in Table 1. All materials in this table satisfy (i) except Al which forms a compound with C, but at a low temperature and low carbon concentration as in the CVD condition, the reaction will neither be efficient nor detrimental. According to the table, Ge and Cu do not become liquid at the typical CVD temperature of 900° C. Above their melting temperature, the vapor pressure becomes too high. On the other hand, the melting temperature of Sn, Ga, In and Al are very low, and therefore satisfy (ii). However, they do not satisfy (iii), that is, their vapor pressure is too high at 900° C. Since these materials melt at much lower temperature, if the CVD temperature can be reduced, the vapor pressure of these materials would be reduced and this will be a part of the strategy of the present invention.

TABLE 1

Some substrate materials

| Material | Density | Melting point (° C.) | Vapor pressure @900° C. (torr) |
| --- | --- | --- | --- |
| Ge | 5.35 | 937 | $3 \times 10^{-6}$ @melting point |
| Cu | 8.92 | 1083 | $8 \times 10^{-4}$ @melting point |
| Sn | 7.28 | 232 | $5 \times 10^{-5}$ |
| Ga | 6.10 | 30 | $7 \times 10^{-4}$ |
| In | 7.30 | 157 | $8 \times 10^{-3}$ |
| Al | 2.70 | 660 | $1 \times 10^{-5}$ |

2) In order to grow diamond with planar morphology, evidently the substrate itself should be planar. All materials in Table 1 tend to form a solid blob due to their strong surface tension. When these materials are melted on some refractory metals, single crystal silicon, graphite and boron nitride, they do not produce a uniformly spread liquid layer. Consequently, a macroscopic planar diamond layer would not be formed. However, when transition metals such as nickel are employed as a support base on which to coat the substrate material, there is a wet action between the substrate material and the supporting base and a planar flat substrate is obtained.

An alternative to a template to produce a planar morphology is to use the pre-existing diamond as the substrate for epitaxy, which becomes homo-epitaxy. A limitation is that pre-existing diamond single crystal has a practical size limitation of several mm in dimension. Furthermore, it is not economical for practical applications.

An important aspect of rheotaxy is that in solid epitaxy, generally a diamond seed is required to apply on the substrate. On the liquid substrate, no diamond seeding is necessary and the growth is spontaneous. Apparently due to a high mobility of carbon on the liquid surfaces, an aggregation of carbon to form diamond is facilitated, and in this respect, liquid also acts as a catalytic agent.

DETAILED DESCRIPTION OF THE INVENTION

The method to grow diamond crystal by rheotaxy consists of three parts: stable liquid substrate, planar base support, and diamond deposition.

1) Stable liquid substrate.—The criteria for the substrate are (i) it does not react with carbon, (ii) it melts at the temperature of diamond deposition, and (iii) the vapor pressure of the substrate material should be low. The materials listed in Table 1 can be divided into two groups according to their melting temperature: Group 1: Ga, In, Sn and Al are liquid at the typical diamond deposition temperature of 900° C. However, their vapor pressure at this temperature is very high and diamond crystallites would be poorly formed. For example, Sn has a vapor pressure of $5 \times 10^{-5}$ torr and the diamond forms only marginally. Therefore, a material with vapor pressure to be much lower than $5 \times 10^{-5}$ torr is suggested.

A strategy for lowering of the vapor pressure is to lower the diamond deposition temperature. Since the vapor pressure is sensitively dependent on the temperature, a drastic pressure reduction can be obtained when the CVD temperature can be reduced. According to Table 2, for example, when the substrate temperature is reduced from 900 to 600° C., Al, Sn and Ga would have excellently low vapor pressure. If the temperature can be further reduced to 500° C., In would also be an excellent substrate material. It remains that an arbitrary temperature reduction could effect the quality of the diamond growth and this aspect, in combination with the dependence on the substrate material, have to be taken into a consideration for a right combination. Here an enrichment of a catalog of substrate material would provide a possibility of other physical parameter selections such as viscosity of the liquid which could effect the dynamics of the crystal growth.

TABLE 2

Vapor pressure at different temperature of some substrate materials

| Material | Melting Point (° C.) | Vapor Pressure (torr) at 500° C. | 600° C. | 700° C. |
|---|---|---|---|---|
| Sn | 232 | $1 \times 10^{-10}$ | $1 \times 10^{-9}$ | $1 \times 10^{-8}$ |
| Ga | 30 | $1 \times 10^{-8}$ | $1 \times 10^{-7}$ | $2 \times 10^{-6}$ |
| In | 157 | $5 \times 10^{-8}$ | $1 \times 10^{-6}$ | $5 \times 10^{-5}$ |
| Al | 600 | $1 \times 10^{-11}$ | $3 \times 10^{-10}$ | $3 \times 10^{-8}$ |

Group 2. According to Table 1, due to a requirement of an in situ liquids state, the low temperature strategy is not be applicable to the case of Cu and Ge due to their solidification at high temperature. For a rheotaxy, the temperature of Ge has to be higher than 937° C., the melting temperature of Ge. Consequently, the vapor pressure would be higher than $3 \times 10^{-6}$ torr. For Cu, a temperature exceeding 1083° C., the melting temperature of Cu, would be required. At this temperature, the vapor pressure would be $1 \times 10^{-5}$ torr, too high for the growth of a continuous diamond film.

In this invention, an indirect strategy is invented: when Ge and Cu are combined, in an atomic ratio of Ge:Cu= 36.5:63.5, the binary system has an eutectic temperature of 644° C. (T. B. Massaltskii, Binary Alloy Phase Diagrams, 1995). Therefore, this alloy could be rheotaxial material with remarkably low vapor pressure. For example, at a typical CVD temperature of 900° C., the vapor pressure of Ge and Cu will be $6 \times 10^{-7}$ and $7 \times 10^{-6}$ torr, respectively. When the deposition temperature is slightly above the eutectic temperature, the substrate work remains in a liquid state and the pressure would be unprecedentedly low, therefore, a vastly improved diamond film can be expected.

In addition to the Ge and Cu eutectic system, Ge with Al also has an eutectic with a lower eutectic temperature of 420° C. at 28.4 atomic % of Ge and 71.6 atomic % of Al. (T. B. Massaltskii, Binary Alloy Phase Diagrams, 1995) Although Al does form a compound with C, but at a low temperature and low C concentration under CVD condition, the reaction between Al and C would not be detrimental 2) Planar Base Support.—A planar template is mandatory in order to form a planar diamond morphology for many device applications. In the case of solid substrate, this requirement is naturally satisfied. In the case of liquid substrate, due to a high surface tension, all candidate materials show the same tendency to form a blob when they are melted on various supporting plates, such as graphite, silicon, boron nitride, and many refractory metals. A phenomenological description is that these materials do not wet the supporting body. One possible mechanism is an existence of an oxide film in the case of silicon and refractory metals. On the surface of oxide free surfaces, such as that of Au and Pt, and substrate materials do wet and a flat surface substrate can be made. However, due to high mutual solubility of these precious metals with the substrate materials, once they are completely dissolved to each other, the planar morphology is again destroyed. In a continuous search for supporting body materials, we have found nickel is a satisfactory substance.

Based on nickel, a composite template structure can be made on the nickel plate, a thin layer of substrate material is coated. There is a critical thickness of the substrate material: if it is too thin, the microscopic structure of the film is discontinuous and if it is too thick, it tends to break up to form small individual blobs. In the case of In on glass, the critical thickness is about 100 nanometer. A substrate structure consisting of Ni or other transition metals with a layer of the substrate material of Table 1 will form a composite substrate for rheotaxy and for the planar supporting body.

3) Diamond Deposition.—A method for diamond deposition referred to in the present invention is a hot filament chemical vapor deposition, as used in the majority of diamond synthesis since the original work of Derjaguin (B. V. Derjaguin and J. V. Fedoseer, New Diamond Sci. and Tech. Material Research Society, Proc. 1990). Two particular aspects in the invention are (i) low temperature deposition system combined with (ii) organized growth. They will be described below.

(i) Deposition system.—The principle is to deposit carbon on a selected substrate. Carbon is derived from a decomposition of hydrocarbon gas in a rich hydrogen ambient with an assistance of hot filament. A particular aspect is the following incorporation. In order to reduce the vapor pressure of the substrate, thus to maintain the substrate surface integrity, an effectively low substrate temperature will be utilized. One low temperature CVD method is to incorporate microwave with the CVD. (Y. Saito et al. J. Mater. Sci. 23, 842 (1988)). A difficulty to incorporate this method with the present invention is a possible interference between the microwave field with the biased field and the field for electrophoreses to be made in the present invention. A more practical method for the present purpose is to add a minute amount of oxygen and an adjustment of the temperature of substrate and of filament. A low substrate temperature of 450° C. to grow diamond has been reported (Z. Li Tolt et al. J. Mater. Res. 12, 13344 (1997)). With this approach, the high vapor pressure deficiency of the substrate material would be eliminated.

(ii) Organized diamond crystal growth.—The organized diamond crystal growth consists of two processes, orientation and coalescence. The oriented aggregation of diamond crystal will be induced by an application of a biased field. In the work of Stoner and Glass, the bias is applied between the hot filament and the substrate (B. R. Stoner and J. T. Glass, Appl. Phys. Lett. 60, 698 (1992)). They are parallel to each other with a specified orientation, thus the field is longitudinal. In the present invention, an additional transverse field will be applied across the substrate. The aim of this transverse field is to create an electrophoresis of the diamond islets in the liquid for rheotaxy. This process will aid in the alignment of the islets through a translational motion to form a single crystal. The longitudinal and the translational field can be combined and produced with an unsymmetrical electrode configuration. In the case of hot filament CVD, with the filament as one electrode and the substrate as a counter electrode, unsymmetry can be created by reducing overall area of the hot filament, such that the field line between the two electrode has both longitudinal and transverse components.

An alternative approach is to maintain the longitudinal symmetrical field configuration and simultaneously an additional electrode pair is attached perpendicularly with respect to the surface of the rheotaxial liquid.

The above field configurations are applicable to the CVD system. In the solid carbon precursor system, the atomic carbon will be generated by a thermal pyrolysis. In the case of dispersing the carbon as a powder on the rheotaxial liquid, in principle, the hot-filament approach can still be applied even if the purpose was not to dissociate the hydrocarbon, rather as a source to create heat and electrons.

When the solid carbon is compressed into plate form, the plate can be an electrode with the substrate as a counter electrode. The plate can be electroded symmetrically or unsymmetrically as the hot filament in the CVD case.

An utility of the top plate of the solid carbon source is based on which a compression can be applied for two purposes: (i) to maintain an intimate contact between the carbon source and the rheotaxial liquid such that vastly more carbon atoms will be participating in diamond synthesis sumltaneously. In comparison, in the CVD case, the participating carbon atoms will be approximately the carbon density in a vapor. Therefore, the ratio of the synthesis efficacy between the solid and the vapor will be approximately the carbon atomic density in solid versus gas. This ratio will be an astronomical $10^{10}$ times. This effect will increase the growth rate and an improvement of the diamond film continuity.

Still another utility of the top plate with exerted compression is to maintain the substrate liquid in a flat form instead of a blob form and, without a reliance on a wetting supporting base.

One important aspect of the present invention is an introduction of a mechanism for diamond coalescence through a translational motion of the diamond crystallites through an electrophoresis. Electrophoresis is a classical process widely used in liquid chemistry and biology (David M. Hawcroft, *Electrophoreses* (Oxford Univ. Press, N.Y. 1997)) but this will be the first time in diamond growth. This process becomes possible because of an involvement of a liquid medium in the present invention involving rheotaxy. In an elaborate scheme consisting of C, Ni and H, Yang et al. have successfully oriented diamond crystals through a rotation in an eutectic (Ni, C) liquid (P. C. Yang, W. Zhu and J. T. Glass, J. Mat. Res. 8, 1773 (1993)), however, these crystals are individually localized and pinned to the solid substrate of Ni and Si, and there is no provision for a coalescence to form a large single crystal. In the present invention, both rotational and translational motions become possible because of the movement is on a liquid substrate, and thus a formation of large single crystal diamond is provided.

What I claim:

1. A method for growing a diamond crystal on a rheotaxy template, said method comprising the steps of:
   (a) providing a carbon precursor source for diamond deposition;
   (b) providing a liquids material as a template for growing a diamond crystal thereon, said liquidous material being supported on a planar base substrate; and,
   (c) causing diamond growth on said liquidus material.

2. The method of claim 1, wherein the carbon precursor is obtained from a dissociated hydrocarbon in a rich hydrogen ambient.

3. The method of claim 2, wherein the carbon precursor is obtained from a thermal dissociation of fullerene in the presence of hydrogen.

4. The method of claim 3, wherein the liquids material contains rare earths and wherein the carbon precursor is obtained from a dissociation of a rare earth carbide through an interaction of the rare earths in the liquids material.

5. The method of claim 1, wherein the planar base substrate comprises a material which does not form a compound with carbon.

6. The method of claim 1, wherein the substrate forms liquid at the temperature of 450 to 900° C. for diamond deposition.

7. The method of claim 1, wherein the substrate has a low vapor pressure at the condition of diamond deposition in the range of $10^{-5}$ to $10^{-10}$ torr.

8. The method of claim 1, wherein the substrate comprises Ga, In, Sn and Al for low temperature diamond growth up to 800° C.

9. The method of claim 1, wherein the substrate is an eutectic alloy of Ge with Cu near an atomic ratio of Ge:Cu=36.5:63.5.

10. The method of claim 1, wherein the substrate is an eutectic alloy of Ge with Al near an atomic ratio of Ge:Al=28.4:71.6.

11. The method of claim 1, wherein the diamond growth is carried out at a lower temperature than 900° C. to reduce the vapor pressure of the substrate material.

12. The method of claim 1, wherein the support body of the substrate material is comprised of transition metals Fe, Co, or Ni.

13. The method of claim 1, wherein a longitudinal electrical field is established for a uniform orientation of the diamond crystal.

14. The method of claim 1, wherein a transverse electric field is established for a translational motion to coalescence the diamond crystal.

15. A method to grow diamond crystal on a rheotaxial template with solid carbon precursor arranged in a plate form.

16. The said solid carbon plate of claim 15 is connected with electrical field to accomplish an organized diamond crystal growth.

17. The said solid carbon plate of claim 15 is compressed against the liquid substrate to maintain a planar configuration.

18. The method of claim 1 wherein an electrical field is utilized to cause said diamond growth on said liquidus material.

19. The method of claim 1 wherein a thermal fluctuation is utilized to cause said diamond growth on said liquidus material.

20. The method of claim 1 wherein a gas turbulence is utilized to cause said diamond growth on said liquidus material.

21. The method of claim 1 wherein a mechanical vibration is utilized to cause said diamond growth on said liquidus material.

22. The method of claim 15 wherein said solid carbon plate is subjected to a thermal fluctuation to accomplish an organized diamond crystal growth.

23. The method of claim 15 wherein said solid carbon plate is subjected to a gas turbulence to accomplish an organized diamond crystal growth.

24. The method of claim 15 wherein said solid carbon plate is subjected to a mechanical vibration to accomplish an organized diamond crystal growth.

25. The method of claim 15 wherein said solid carbon plate is subjected to an electrical field to accomplish an organized diamond crystal growth.

\* \* \* \* \*